(12) United States Patent
Meyer et al.

(10) Patent No.: US 8,659,154 B2
(45) Date of Patent: Feb. 25, 2014

(54) SEMICONDUCTOR DEVICE INCLUDING ADHESIVE COVERED ELEMENT

(75) Inventors: Thorsten Meyer, Regensburg (DE); Jens Pohl, Bernhardswald (DE)

(73) Assignee: Infineon Technologies AG, Neubiberg (DE)

( * ) Notice: Subject to any disclaimer, the term of this patent is extended or adjusted under 35 U.S.C. 154(b) by 784 days.

(21) Appl. No.: 12/048,602

(22) Filed: Mar. 14, 2008

(65) Prior Publication Data

US 2009/0230553 A1    Sep. 17, 2009

(51) Int. Cl.
*H01L 23/48* (2006.01)

(52) U.S. Cl.
USPC .... 257/738; 257/678; 257/734; 257/E27.113; 438/106; 438/121

(58) Field of Classification Search
USPC .......... 361/760; 257/724, 723, 730, E23.069, 257/E23.071, E23.057, E23.126, E23.127, 257/678, 738, 630, E23.006, 734, E27.113; 438/455, 108, 106, 121
See application file for complete search history.

(56) References Cited

U.S. PATENT DOCUMENTS

| | | | |
|---|---|---|---|
| 6,313,521 B1 * | 11/2001 | Baba | 257/678 |
| 6,909,194 B2 | 6/2005 | Farnworth et al. | |
| 7,061,123 B1 | 6/2006 | Chee et al. | |
| 7,217,646 B2 | 5/2007 | Hedler et al. | |
| 2002/0086500 A1 * | 7/2002 | Wu et al. | 438/455 |
| 2002/0110956 A1 * | 8/2002 | Kumamoto et al. | 438/108 |
| 2002/0140085 A1 * | 10/2002 | Lee et al. | 257/724 |
| 2007/0096249 A1 | 5/2007 | Roeper et al. | |
| 2007/0109757 A1 * | 5/2007 | Lee et al. | 361/760 |
| 2008/0042265 A1 | 2/2008 | Merilo et al. | |

FOREIGN PATENT DOCUMENTS

EP    0611129    8/1994

OTHER PUBLICATIONS

"Embedded Wafer Level Ball Grid Array", M. Brunnbauer, et al., Electronics Packaging Technology Conference, 2006 (4 pgs.).

* cited by examiner

*Primary Examiner* — Eugene Lee
*Assistant Examiner* — Fang-Xing Jiang
(74) *Attorney, Agent, or Firm* — Dicke, Billig & Czaja, PLLC

(57) ABSTRACT

A semiconductor device includes a chip, at least one element electrically coupled to the chip, an adhesive at least partially covering the at least one element, and a mold material at least partially covering the chip and the adhesive.

25 Claims, 4 Drawing Sheets

SEMICONDUCTOR DEVICE INCLUDING ADHESIVE COVERED ELEMENT

BACKGROUND

Embedded wafer level ball grid array (eWLB) technology expands on typical wafer level packaging technologies by providing the ability for adding additional surface area for interconnecting silicon components in a semiconductor device. Therefore, eWLB technology provides the possibility of fabricating a semiconductor device by combining both active and passive silicon components into a single module. Passive components, however, are typically very small or include geometries (e.g., small surface area with large height) unfavorable to the molding process used to package the semiconductor device. The small components may not adhere to the carrier foil during the molding process due to the forces applied to the small components by the molding process. This may lead the small components to slip and break contact with the carrier foil.

For these and other reasons, there is a need for the present invention.

SUMMARY

One embodiment provides a semiconductor device. The semiconductor device includes a chip, at least one element electrically coupled to the chip, an adhesive at least partially covering the at least one element, and a mold material at least partially covering the chip and the adhesive.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Figure 1:
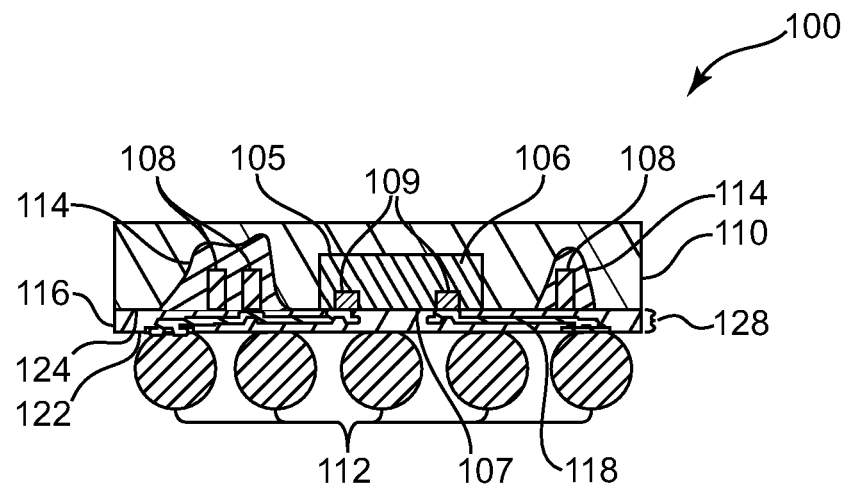
FIG. 1 illustrates a cross-sectional view of one embodiment of a semiconductor device.

FIG. 1 illustrates a cross-sectional view of one embodiment of a semiconductor device 100. Semiconductor device 100 is fabricated using a wafer level packaging process. Semiconductor device 100 includes a semiconductor chip 106, at least one element 108, an adhesive material 114, a molding material 110, a redistribution layer 128, and solder balls 112. In this embodiment, semiconductor device 100 includes a first, a second, and a third element 108. Two of the elements 108 are positioned laterally adjacent to a first side of the semiconductor chip 106 and one of the elements 108 is positioned laterally adjacent to a second side of the semiconductor chip 106 opposite to the first side of the semiconductor chip 106. A first side of each of the first, second, and third elements 108 is coupled to redistribution layer 128. Adhesive material 114 covers at least a portion of each element 108. Molding material 110 encapsulates at least one side of each semiconductor chip 166 and at least one side of each element 108 and adhesive material 114. Adhesive material 114 provides stability to elements 108 during the molding process so that elements 108 are not shifted, misplaced, or tilted after the molding process. In one embodiment, adhesive material 114 includes Durimide, a polyimide, an elastomer, a thermoplastic, an epoxy, or another suitable adhesive.

Semiconductor chip 106 has a first face 105 and an opposing second face 107. Semiconductor chip 106 includes contacts 109 with an exposed surface on the same plane as opposing second face 107. Redistribution layer 128 also has a first face 124 and an opposing second face 122. First face 124 of redistribution layer 128 is attached along second face 107 of chip 106.

In one embodiment, each element 108 is a passive component. In one embodiment, each element 108 includes a resistor, a capacitor, an inductor, a conductor, a solder element, a conductive sphere, or another suitable passive component. In one embodiment, the volume of each element 108 is less than the volume of semiconductor chip 106 by at least a factor of two. In another embodiment, the height of each element 108 is greater than the height of chip 106 in the direction perpendicular to redistribution layer 128.

Redistribution layer 128 includes insulating material 116 and conductive traces 118, which electrically couple semiconductor chip 106 to at least one element 108. Further, conductive spheres or solder balls 112 can be electrically coupled to conductive traces 118 at second face 124 of redistribution layer 128. Conductive traces 118 include Cu or other suitable conductive material or conductive material stack. Insulating material 116 includes a polyimide, an epoxy, or another suitable dielectric material.

Figure 2:
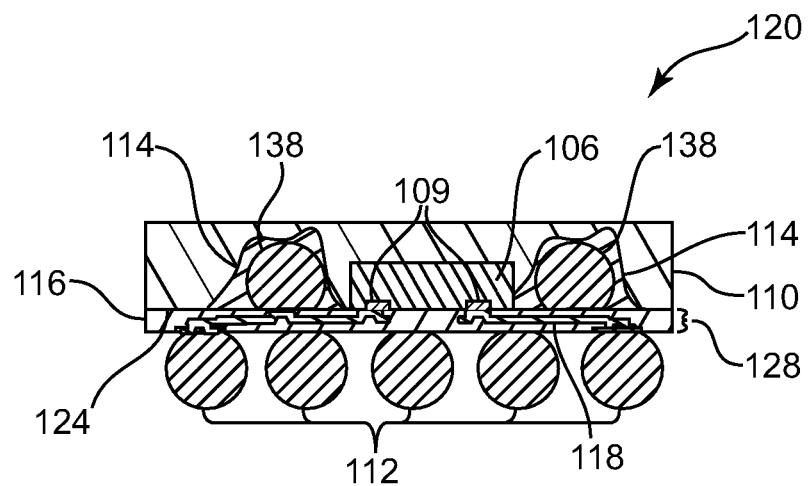
FIG. 2 illustrates a cross-sectional view of another embodiment of a semiconductor device.

FIG. 2 illustrates a cross-sectional view of another embodiment of a semiconductor device 120. Semiconductor device 120 is similar to semiconductor device 100 previously described and illustrated with reference to FIG. 1, except that elements 108 are replaced with conductive spheres or solder elements or balls 138 in semiconductor device 120. In this embodiment, adhesive material 114 provides stability to solder elements 138 during the molding process so that solder elements 138 are not shifted or misplaced after the molding process. Solder elements 138 can be used for 3D-contacts from the front-side to the back-side of the package.

The following FIGS. 3 through 9B illustrate embodiments of a process for fabricating a semiconductor device. FIGS. 5A, 6A, 7A, 8A, and 9A illustrate one embodiment for fabricating a semiconductor device, such as semiconductor device 100 previously described and illustrated with reference to FIG. 1. FIGS. 5B, 6B, 7B, 8B, and 9B illustrate another embodiment for fabricating a semiconductor device, such as semiconductor device 120 previously described and illustrated with reference to FIG. 2.

Figure 3:
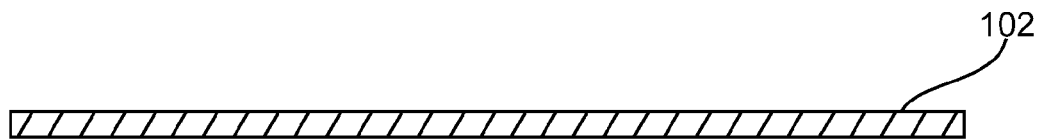
FIG. 3 illustrates a cross-sectional view of one embodiment of a carrier.

FIG. 3 illustrates a cross-sectional view of one embodiment of a carrier 102. Carrier 102 includes a metal, a polymer, silicon, or another suitable material.

Figure 4:
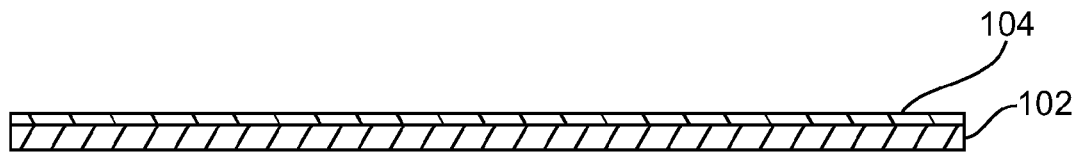
FIG. 4 illustrates a cross-sectional view of one embodiment of the carrier and a double-sided adhesive foil.

FIG. 4 illustrates a cross-sectional view of one embodiment of carrier 102 and a double-sided adhesive foil 104. A double-sided, releasable, adhesive foil 104 is laminated to carrier 102 or applied to carrier 102 using another suitable technique. In other embodiments, other suitable adhesives are used in place of adhesive foil 104.

Figure 5A:
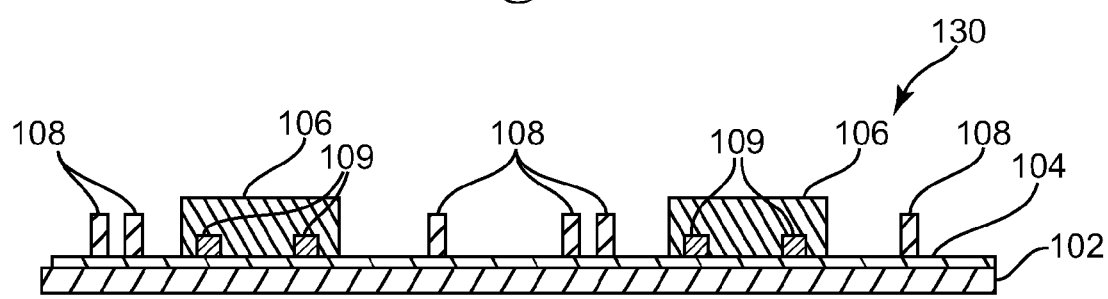
FIG. 5A illustrates a cross-sectional view of one embodiment of the carrier, the double-sided adhesive foil, elements, and semiconductor chips.

FIG. 5A illustrates a cross-sectional view of one embodiment of carrier 102, double-sided adhesive foil 104, elements 108, and semiconductor chips 106. Each element 108 and each semiconductor chip 106 is placed on adhesive foil 104. In one embodiment, at least two semiconductor chips 106 and at least two elements 108 are placed on adhesive foil 104. In one embodiment, the area of the surface of each element 108 at the interface to adhesive foil 104 is less than the area of the surface of semiconductor chip 106 at the interface to adhesive foil 104.

Figure 5B:
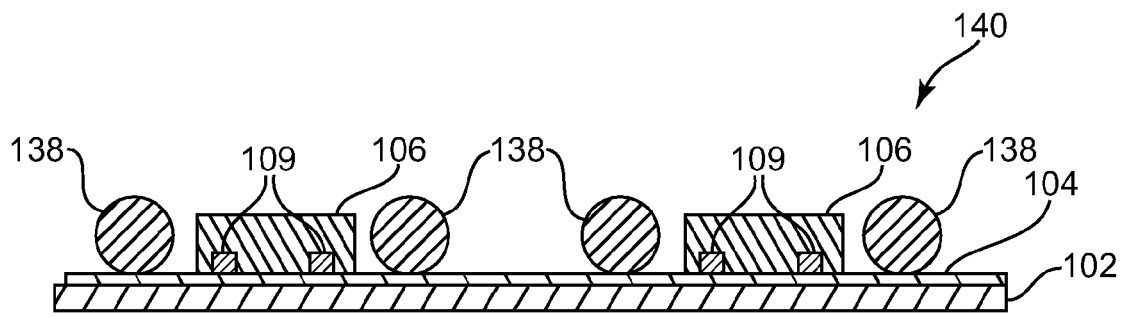
FIG. 5B illustrates a cross-sectional view of one embodiment of the carrier, the double-sided adhesive foil, solder elements, and semiconductor chips.

FIG. 5B illustrates a cross-sectional view of one embodiment of carrier 102, double-sided adhesive foil 104, solder elements 138, and semiconductor chips 106. Each semiconductor chip 106 and each solder element 138 is placed on adhesive foil 104. In one embodiment, at least two semiconductor chips 106 and at least two solder elements 138 are placed on adhesive foil 104. Due to the non-planar or spherical form of solder elements 138, solder elements 138 have less surface area than semiconductor chips 106 for attachment to adhesive foil 104.

Figure 6A:
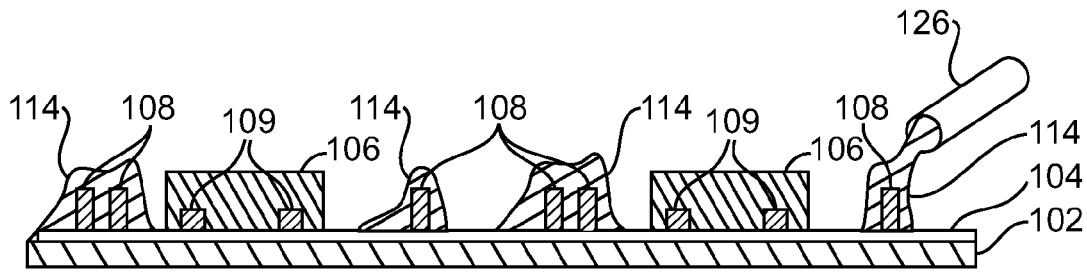
FIG. 6A illustrates a cross-sectional view of one embodiment of the carrier, the double-sided adhesive foil, the elements, the semiconductor chips, and an adhesive material.

FIG. 6A illustrates a cross-sectional view of one embodiment of carrier 102, double-sided adhesive foil 104, elements 108, semiconductor chips 106, and adhesive material 114. In one embodiment, a dispensing needle 126 dispenses an adhesive material 114 to adhere each element 108 to adhesive foil 104. Adhesive material 114 includes an epoxy, a thermoplastic, a silicone, a polyimide, an elastomer, or another suitable material. Adhesive material 114 at least partially covers each element 108 and provides improved attachment of elements 108 to adhesive foil 104 prior to molding. In another embodiment, a printing process, a jetting process, or another suitable process is used to apply adhesive material 114 over or at each element 108.

Adhesive material 114 can then be cured by using any suitable form of energy (e.g., thermal, chemical) if a curing step is needed for the adhesive material. In one embodiment, semiconductor chip 106 is placed in close proximity to elements 108; thereby adhesive material 114 is also applied to at least one surface of semiconductor chip 106. In another embodiment, adhesive material 114 is applied to at least a portion of adhesive foil 104 before elements 108 are placed on adhesive foil 104. Elements 108 are then placed into adhesive material 114.

Figure 6B:
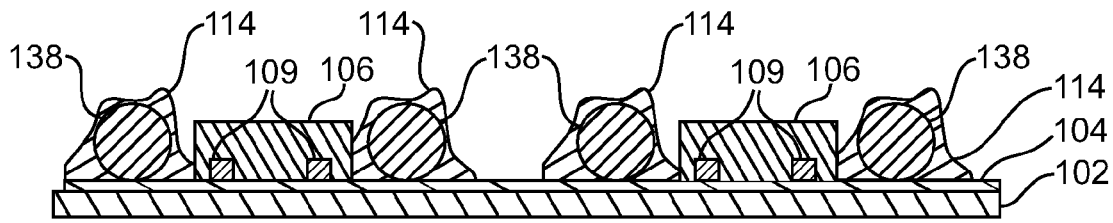
FIG. 6B illustrates a cross-sectional view of one embodiment of the carrier, the double-sided adhesive foil, the solder elements, the semiconductor chips, and an adhesive material.

FIG. 6B illustrates a cross-sectional view of one embodiment of carrier 102, double-sided adhesive foil 104, solder elements 138, semiconductor chips 106, and adhesive material 114. In one embodiment, a dispensing needle dispenses an adhesive material 114 to adhere each solder element 138 to adhesive foil 104. Adhesive material 114 includes an epoxy or another suitable material. Adhesive material 114 at least partially covers each solder element 138 and provides improved attachment of solder elements 138 to adhesive foil 104 prior to molding. In another embodiment, a printing process, a jetting process, or another suitable process is used to apply adhesive material 114 over or at each solder element 138.

Adhesive material 114 can then be cured by using any suitable form of energy (e.g., thermal, chemical) if a curing step is needed for the adhesive material. In one embodiment, semiconductor chip 106 is placed in close proximity to solder elements 138; thereby adhesive material 114 is also applied to at least one surface of semiconductor chip 106. In another embodiment, adhesive material 114 is applied to at least a portion of adhesive foil 104 before solder elements 138 are placed on adhesive foil 104. Solder elements 138 are then placed into adhesive material 114.

Figure 7A:
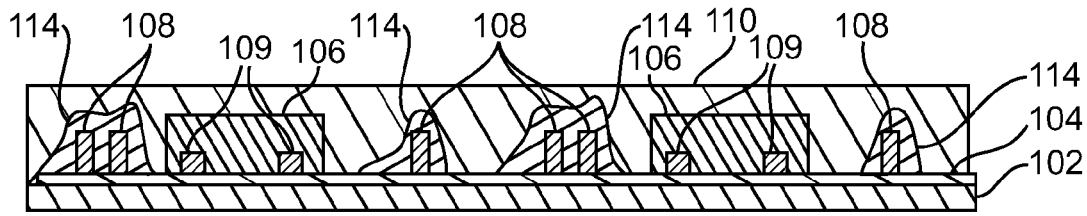
FIG. 7A illustrates a cross-sectional view of one embodiment of the carrier, the double-sided adhesive foil, the elements, the semiconductor chips, the adhesive material, and a molding material.

FIG. 7A illustrates a cross-sectional view of one embodiment of carrier 102, double-sided adhesive foil 104, elements 108, semiconductor chips 106, adhesive material 114, and molding material 110. Adhesive material 114, elements 108, and semiconductor chips 106 are at least partially encapsulated by molding material 110. In one embodiment, the entire encapsulation process is performed by mold encapsulation. Carrier 102 is placed in a molding tool. A liquid mold compound having a high viscosity is dispensed in the center of carrier 102 where semiconductor chips 106 and elements 108 have been placed. The top of the molding tool is closed, causing the liquid mold compound to flow from the center to the edges of the molding tool. Flow of the mold compound applies forces on semiconductor chips 106 and elements 108. Due to adhesive material 114, however, elements 108 do not shift or tilt in response to the forces.

Figure 7B:
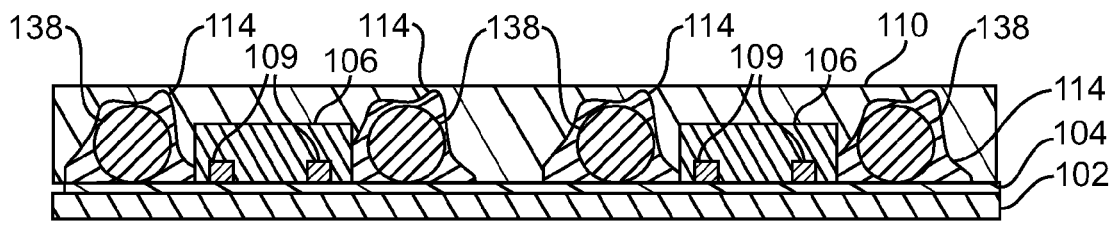
FIG. 7B illustrates a cross-sectional view of one embodiment of the carrier, the double-sided adhesive foil, the solder elements, the semiconductor chips, the adhesive material, and a molding material.

FIG. 7B illustrates a cross-sectional view of one embodiment of carrier 102, double-sided adhesive foil 104, solder elements 138, semiconductor chips 106, adhesive material 114, and molding material 110. Adhesive material 114, solder elements 138, and semiconductor chips 106 are at least partially encapsulated by molding material 110 using a similar process as described with reference to FIG. 7A. Due to adhesive material 114, solder elements 138 do not shift during the molding process.

Figure 8A:
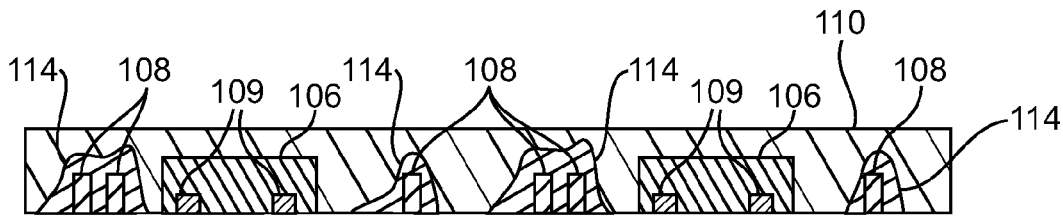
FIG. 8A illustrates a cross-sectional view of one embodiment of the elements, the semiconductor chips, the adhesive material, and the molding material after the release of the carrier and the double-sided adhesive foil.

FIG. 8A illustrates a cross-sectional view of one embodiment of elements 108, semiconductor chips 106, adhesive material 114, and molding material 110 after release of carrier 102 and double-sided adhesive foil 104. The release of adhesive foil 104 and carrier 102 is completed after application of molding material 110. One surface of each element 108 and each semiconductor chip 106 is exposed where adhesive foil 104 was previously attached.

Figure 8B:
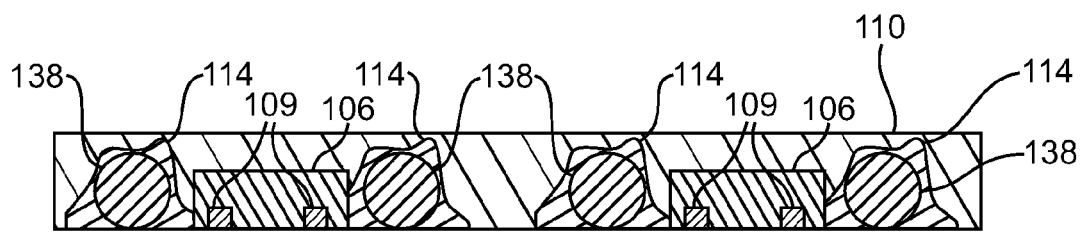
FIG. 8B illustrates a cross-sectional view of one embodiment of the solder elements, the semiconductor chips, the adhesive material, and the molding material after release of the carrier and the double-sided adhesive foil.

FIG. 8B illustrates a cross-sectional view of one embodiment of solder elements 138, semiconductor chips 106, adhesive material 114, and molding material 110 after release of carrier 102 and double-sided adhesive foil 104. A surface of each solder element 138 and each semiconductor chip 106 is exposed where adhesive foil 104 was previously attached.

Figure 9A:
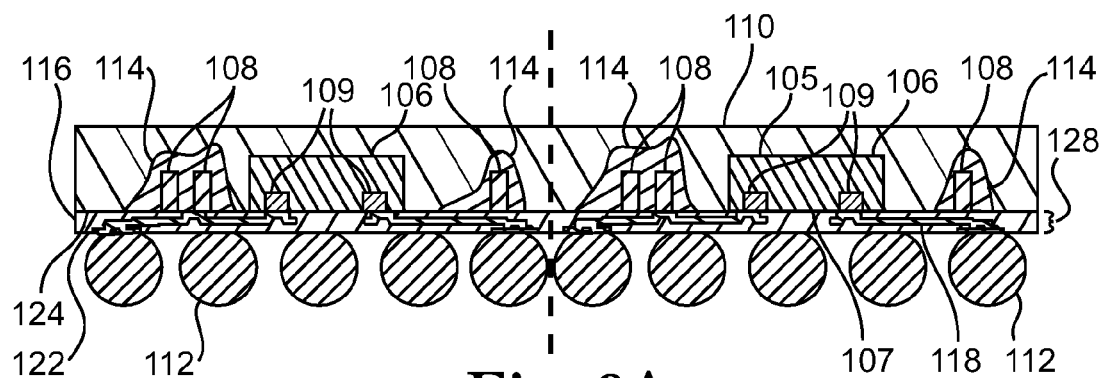
FIG. 9A illustrates a cross-sectional view one embodiment of multiple semiconductor devices prior to singulation.

FIG. 9A illustrates a cross-sectional view of one embodiment of multiple semiconductor devices prior to singulation. A redistribution layer 128 is fabricated. Redistribution layer 128 includes conductive traces 118 formed in a conductive layer. Conductive traces 118 on first face 124 of redistribution layer 128 are electrically coupled to and directly contact semiconductor chips 106 and/or elements 108. Redistribution layer 128 also includes insulating material 116 surrounding conductive traces 118. Conductive spheres or solder balls 112 are electrically coupled to conductive traces 118 on second face 122 of redistribution layer 128.

The semiconductor devices are then separated from one another. The dashed line in FIG. 9A indicates where molding material 110 and redistribution layer 128 are cut to separate the semiconductor devices. Each semiconductor device includes a semiconductor chip 106 and at least one element 108. The semiconductor devices are separated by sawing, etching, or other suitable method to provide semiconductor devices 100 as previously described and illustrated with reference to FIG. 1.

Figure 9B:
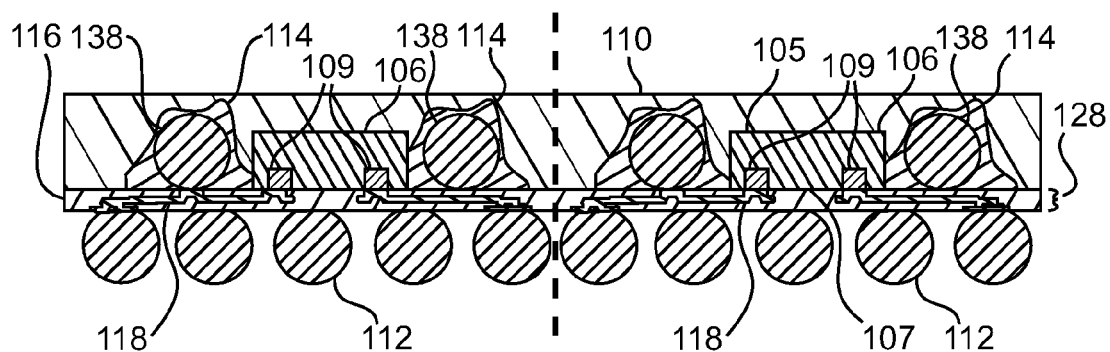
FIG. 9B illustrates a cross-sectional view of another embodiment of multiple semiconductor devices prior to singulation.

FIG. 9B illustrates a cross-sectional view of another embodiment of multiple semiconductor devices prior to singulation. A redistribution layer 128 and conductive spheres or solder balls 112 are fabricated using a similar process as previously described with reference to FIG. 9A. The dashed line in FIG. 9B indicates where molding material 110 and redistribution layer 128 are cut to separate the semiconductor devices. Each semiconductor device includes a semiconductor chip 106 and at least one solder element 138. The semiconductor devices are separated by sawing, etching, or other suitable method to provide semiconductor devices 120 as previously described and illustrated with reference to FIG. 2.

Embodiments provide semiconductor devices using eWLB technology. Elements and/or solder balls are placed on adhesive foil in addition to semiconductor chips. Adhesive material is deposited over or at the elements and/or solder balls to provide increased stability and decreased displacement of the elements and/or solder balls during the molding process. After the adhesive material adheres to the elements and/or solder balls and the adhesive foil, the semiconductor chips, elements and/or solder balls, and adhesive material are encapsulated in mold material.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device comprising:
   a chip;
   at least one element electrically coupled to the chip;
   an adhesive at least partially covering the at least one element;
   a mold material at least partially covering the chip and the adhesive, the mold material directly contacting the chip; and
   a planar redistribution layer consisting of conductive traces and a single insulating material, one of the conductive traces directly contacting the chip and the at least one element,
   wherein the at least one element is laterally adjacent to the chip along a direction that is in a plane of an active surface of the chip.

2. The semiconductor device of claim 1, wherein the at least one element comprises one of a resistor, a capacitor, an inductor, a conductor, a solder element, and a conductive sphere.

3. The semiconductor device of claim 1, further comprising:
   an array of solder elements electrically coupled to the redistribution layer.

4. The semiconductor device of claim 1, further comprising:
   a redistribution layer electrically coupling the chip to the at least one element; and
   an array of conductive spheres electrically coupled to the redistribution layer.

5. The semiconductor device of claim 1, wherein a volume of the at least one element is less than a volume of the chip by at least a factor of two.

6. The semiconductor device of claim 1, further comprising:
   a redistribution layer electrically coupling the chip to the at least one element,
   wherein in a direction perpendicular to the redistribution layer, a height of the at least one element is greater than a height of the chip.

7. The semiconductor device of claim 1, wherein the adhesive comprises one of Durimide, polyimide, an elastomer, a thermoplastic, and an epoxy.

8. A semiconductor device comprising:
   a semiconductor die;
   a component;
   a planar redistribution layer consisting of conductive traces and a single insulating material, one of the conductive traces directly contacting the semiconductor die and the component;
   an adhesive material at least partially covering the component; and
   a mold compound encapsulating at least one side of the semiconductor die and at least one side of the component and the adhesive material,
   wherein the component is laterally adjacent to the semiconductor die with respect to the redistribution layer.

9. The semiconductor device of claim 8, wherein the component comprises one of a resistor, a capacitor, an inductor, a conductor, a solder element, and a conductive sphere.

10. The semiconductor device of claim 8, wherein the adhesive comprises one of Durimide, polyimide, an elastomer, a thermoplastic, and an epoxy.

11. The semiconductor device of claim 8, wherein a height of the component perpendicular to the redistribution layer is greater than a width of the component.

12. The semiconductor device of claim 8, further comprising:
a plurality of solder balls electrically coupled to the redistribution layer.

13. A semiconductor device comprising:
a chip;
at least one element electrically coupled to the chip;
means for preventing the at least one element from shifting during a molding process;
means for encapsulating at least one side of the chip and at least one side of the at least one element; and
a planar redistribution layer consisting of conductive traces and a single insulating material, one of the conductive traces directly contacting the chip and the at least one element,
wherein the at least one element is laterally adjacent to the chip along a direction that is in a plane of an active surface of the chip.

14. The semiconductor device of claim 13, wherein the at least one element comprises one of a resistor, a capacitor, an inductor, a conductor, a solder element, and a conductive sphere.

15. A semiconductor device comprising:
a semiconductor chip;
a first component electrically coupled to the semiconductor chip;
a planar redistribution layer consisting of conductive traces and a single insulating material, one of the conductive traces directly contacting the semiconductor chip and directly contacting a first side of the first component;
an adhesive material covering all sides of the first component other than the first side;
a mold compound encapsulating the semiconductor chip, the first component, and the adhesive material, the mold compound directly contacting the semiconductor chip; and
an array of solder elements electrically coupled to the redistribution layer,
wherein the first component is laterally adjacent to the semiconductor chip with respect to the redistribution layer.

16. The semiconductor device of claim 15, wherein the first component is electrically coupled to the semiconductor chip via the redistribution layer.

17. The semiconductor device of claim 15, further comprising:
a second component laterally adjacent to the first component with respect to the redistribution layer,
wherein the adhesive material covers the second component such that all space between the first and second components is filled by the adhesive material.

18. The semiconductor device of claim 15, wherein the adhesive material extends above the semiconductor chip with respect to the redistribution layer.

19. The semiconductor device of claim 15, wherein sidewalls of the adhesive material are nonlinear.

20. A semiconductor device comprising:
a planar redistribution layer consisting of conductive traces and a single insulating material;
a semiconductor die directly contacting at least one of the conductive traces of the redistribution layer and directly contacting the insulating material of the redistribution layer;
a first element comprising a first side electrically coupled to and directly contacting at least one of the conductive traces of the redistribution layer, the first element laterally adjacent to a first side of the semiconductor die with respect to the redistribution layer;
a second element comprising a first side electrically coupled to and directly contacting at least one of the conductive traces of the redistribution layer, the second element laterally adjacent to a second side of the semiconductor die opposite the first side of the semiconductor die;
an adhesive material covering all sides of the first element other than the first side of the first element and all sides of the second element other than the first side of the second element;
a mold compound encapsulating the semiconductor die, the first element, the second element, and the adhesive material, the mold compound directly contacting the semiconductor die; and
an array of solder elements electrically coupled to the redistribution layer.

21. The semiconductor device of claim 20, wherein the first element is electrically coupled to the semiconductor die via the redistribution layer.

22. The semiconductor device of claim 20, further comprising:
a third element laterally adjacent to the first element with respect to the redistribution layer,
wherein the adhesive material covers the third element such that all space between the first and third elements is filled by the adhesive material.

23. The semiconductor device of claim 20, wherein the adhesive material extends above the semiconductor die with respect to the redistribution layer.

24. The semiconductor device of claim 20, wherein sidewalls of the adhesive material are nonlinear.

25. The semiconductor device of claim 20, wherein the conductive traces consist of Cu.

* * * * *